United States Patent [19]

Sevalia

[11] Patent Number: 5,757,212

[45] Date of Patent: May 26, 1998

[54] METHOD AND APPARATUS FOR PROVIDING A PIN CONFIGURABLE ARCHITECTURE FOR FREQUENCY SYNTHESIZERS

[75] Inventor: Piyush B. Sevalia, Sunnyvale, Calif.

[73] Assignee: Cypress Semiconductor Corp., San Jose, Calif.

[21] Appl. No.: 576,450

[22] Filed: Dec. 21, 1995

[51] Int. Cl.[6] .................................. H03L 7/00; H03B 27/00
[52] U.S. Cl. ........................ 327/105; 327/99; 327/296; 327/408
[58] Field of Search .............................. 327/105, 106, 327/107, 99, 291, 293, 295–297, 256, 403, 407, 408, 415, 564, 565; 331/48, 49

[56] References Cited

U.S. PATENT DOCUMENTS

| | | | |
|---|---|---|---|
| 4,659,999 | 4/1987 | Motoyama et al. | 331/49 |
| 5,289,138 | 2/1994 | Wang | 331/49 |
| 5,311,053 | 5/1994 | Law et al. | 259/529 |
| 5,319,261 | 6/1994 | Srinivasan et al. | 340/825.91 |
| 5,321,322 | 6/1994 | Verheyen et al. | 327/564 |
| 5,327,104 | 7/1994 | Kikushima | 331/68 |
| 5,371,390 | 12/1994 | Mohsen | 257/209 |
| 5,376,829 | 12/1994 | Rogers et al. | 327/408 |
| 5,400,262 | 3/1995 | Mohsen | 364/489 |
| 5,400,294 | 3/1995 | Srinivasan et al. | 356/230.06 |
| 5,406,138 | 4/1995 | Srinivasan et al. | 326/41 |
| 5,412,261 | 5/1995 | Whitten | 326/41 |
| 5,414,308 | 5/1995 | Lee et al. | 327/293 |
| 5,414,638 | 5/1995 | Verheyen et al. | 364/489 |
| 5,432,708 | 7/1995 | Mohsen | 364/490 |
| 5,448,191 | 9/1995 | Meyer | 327/105 |
| 5,451,811 | 9/1995 | Whitten et al. | 257/530 |
| 5,548,249 | 8/1996 | Sumita et al. | 327/107 |
| 5,565,816 | 10/1996 | Coteus | 327/153 |

FOREIGN PATENT DOCUMENTS

WO 89/06456   1/1988   European Pat. Off. ............... 327/105

*Primary Examiner*—Timothy P. Callahan
*Assistant Examiner*—T. T. Lam
*Attorney, Agent, or Firm*—Blakely Sokolff Taylor & Zafman LLP

[57] ABSTRACT

A pin-configurable frequency synthesizer for providing a choice of physical pin assignments/configurations without costly design and/or bonding changes. A functional block, having a plurality of functional conductors, is provided. The pin-configurable frequency synthesizer is housed in a chip package that includes a plurality of physical pins. A configuration matrix having a plurality of transmission circuits for connecting the functional conductors to the physical pins is also provided. A control circuit for controlling the transmission circuits of the configuration matrix is further provided. This control circuit includes programming logic and a logic array for generating control signals for each of the transmission circuits of the configuration matrix. These control signals direct the transmission circuits to selectively couple each functional conductor to a respective physical pin in accordance with a desired pin assignment. A user uses the programming logic to program the logic array in accordance with the desired pin assignment.

16 Claims, 6 Drawing Sheets

| NAME | DESCRIPTION |
|---|---|
| 32XOUT | 32.768 kHz crystal feedback |
| 32K | 32.768 kHz output (always active if $V_{BATT}$ is present) |
| CLKC | Configurable clock output C |
| $V_{DD}$ | Voltage supply to I/O |
| GND | Ground |
| XTALIN | Reference crystal input or external reference clock input |
| XTALOUT | Reference crystal feedback |
| XBUF | Buffered reference clock output |
| CLKD | Configurable clock output D |
| CPUCLK | CPU ferequency clock output |
| CLKB | Configurable clock output B |
| CLKA | Configurable clock output A |
| FLOPPYCLK | Floppy clock output (24 or 32 MHz) |
| GND | Ground |
| S0 | CPU clock select input, bit 0 |
| S1 | CPU clock select input, bit 1 |
| $V_{DD}$ | Analog voltage supply to core |
| S2/SUSPEND | CPU clock select input, bit 2. Optionaly enables suspend feature when LOW. |
| SHUTDOWN/OE | Places outputs in three-state condition and shuts down chip when LOW. Optionally, only places outputs in three-state condition and does not shut down chip when LOW. |
| $V_{BATT}$ | Battery supply for 32.768 kHz circuit |
| 32XIN | 32.768 kHz crystal input |

Fig. 3B

METHOD AND APPARATUS FOR PROVIDING A PIN CONFIGURABLE ARCHITECTURE FOR FREQUENCY SYNTHESIZERS

BACKGROUND OF THE INVENTION

1. Field of the Invention

The present invention relates generally to the field of integrated circuits. More particularly, the present invention relates to frequency synthesizers, also known as clock generators.

2. Art Background

FIG. 1 illustrates a block diagram of a prior art frequency synthesizer 1. Specifically, the block diagram illustrates the architecture for Cypress frequency synthesizer part CY2291.

As illustrated in FIG. 1, the frequency synthesizer 1 includes a clock signal generator 3. The clock signal generator circuit 3 includes a plurality of inputs for receiving clock frequencies and user inputs and thirty-two outputs for generating thirty-two different clock frequencies. These thirty-two clock frequencies or clock signals are provided to a plurality of multiplexers 4. Each multiplexer 4 has five select lines 5 for selecting one of the thirty-two signals provided to it by the clock signal generator circuit 3. The output of a multiplexer 4 is one of the configurable clock outputs (e.g., CLKA). Each configurable clock output 6 (i.e., CLKA through CLKD) has a separate multiplexer 4. Although this prior art CY2291 synthesizer chip allows a user to select from one of thirty-two different clock frequencies on each of the four configurable outputs, all the pins (including CLKA, CLKB, CLKC, CLKD) on this frequency synthesizer are at fixed locations on the package.

This prior art architecture provides a minimal level of flexibility with the multiplexers 4. As noted previously, the multiplexers 4 allow a user to select from a number of different clock frequencies and have an output pin reflect the user's choice. For example, a user may determine the frequency of a particular configurable output clock pin at programming time (i.e., when a user programs a logic array to set the CLKA-CLKD outputs to predetermined frequencies). Thus, each configurable clock output can be configured to be the frequency that the user desires within operating limits.

However, the remaining pins are fixed output pins which are assigned to a fixed functional pin (or signal source). These fixed output pins cannot be manipulated by the user since their physical pin assignment is immutable.

Additionally, other input pins such as XTALIN, XTALOUT, output enable (OE) signal, and ROM-select signals are also assigned to a fixed physical pin assignment.

Accordingly, the architecture for prior art frequency synthesizers has the following shortcomings. First, when one desires a physical pin assignment that differs from the specified physical pin-out of a chip package, (e.g., when the output enable signal is on pin 6 for a first part, and the output enable signal is on pin 8 for a second part), to make the first part compatible with the new physical pin definition, one of two techniques needs to be employed. First, one could change the bonding so that the functional pins are physically coupled to the physical pins in accord with the new pin definition (if this is physically possible). Second, one could change masks or layout and implement the new pin definition at the circuit level. Both of these options waste both time and resources.

Accordingly, there is a need for a new architecture for frequency synthesizers that performs the routing of the functional pins to a desired physical pin assignment at programming time.

SUMMARY OF THE INVENTION

The present invention is a method and apparatus for providing a pin-configurable architecture for a Phase Locked Loop (PLL)-based frequency synthesizer. The present invention includes a configuration matrix that routes the functional conductors to the desired physical pins of the chip package (i.e., a predetermined physical pin assignment) at programming time.

The present invention includes a functional block having a frequency synthesizer and a plurality of functional conductors. Each of these functional conductors represents a functional signal (e.g., XTALIN signal, XTALOUT signal, the clock output signals). A chip package houses the pin-configurable frequency synthesizer of the present invention and includes a plurality of physical pins that allow access by other circuits to the functional signals contained therein. The configuration matrix includes a plurality of transmission circuits. These transmission circuits selectively couple each of the functional conductors to each of the physical pins in response to a plurality of control signals. The present invention also includes a configuration matrix control circuit for generating the control signals that direct the transmission circuits to selectively couple each functional conductors to an associated physical pin in accordance with a desired physical pin assignment. The configuration matrix control circuit generates a control signal for each transmission circuit in the configuration matrix.

BRIEF DESCRIPTION OF DRAWINGS

The present invention is illustrated by way of example and not limitation in the figures of the accompanying drawings in which like references indicate similar elements.

FIG. 3B illustrates the functional signals, associated with the functional block of FIG. 3A.

DETAILED DESCRIPTION OF THE INVENTION

In the following detailed description of the present invention, numerous specific details are set forth in order to provide a thorough understanding of the present invention. However, it will be obvious to one skilled in the art that the present invention may be practiced without these specific details. In other instances, well known electrical structures and circuits are shown in block diagram form in order not to unnecessarily obscure aspects of the present invention.

Figure 1:
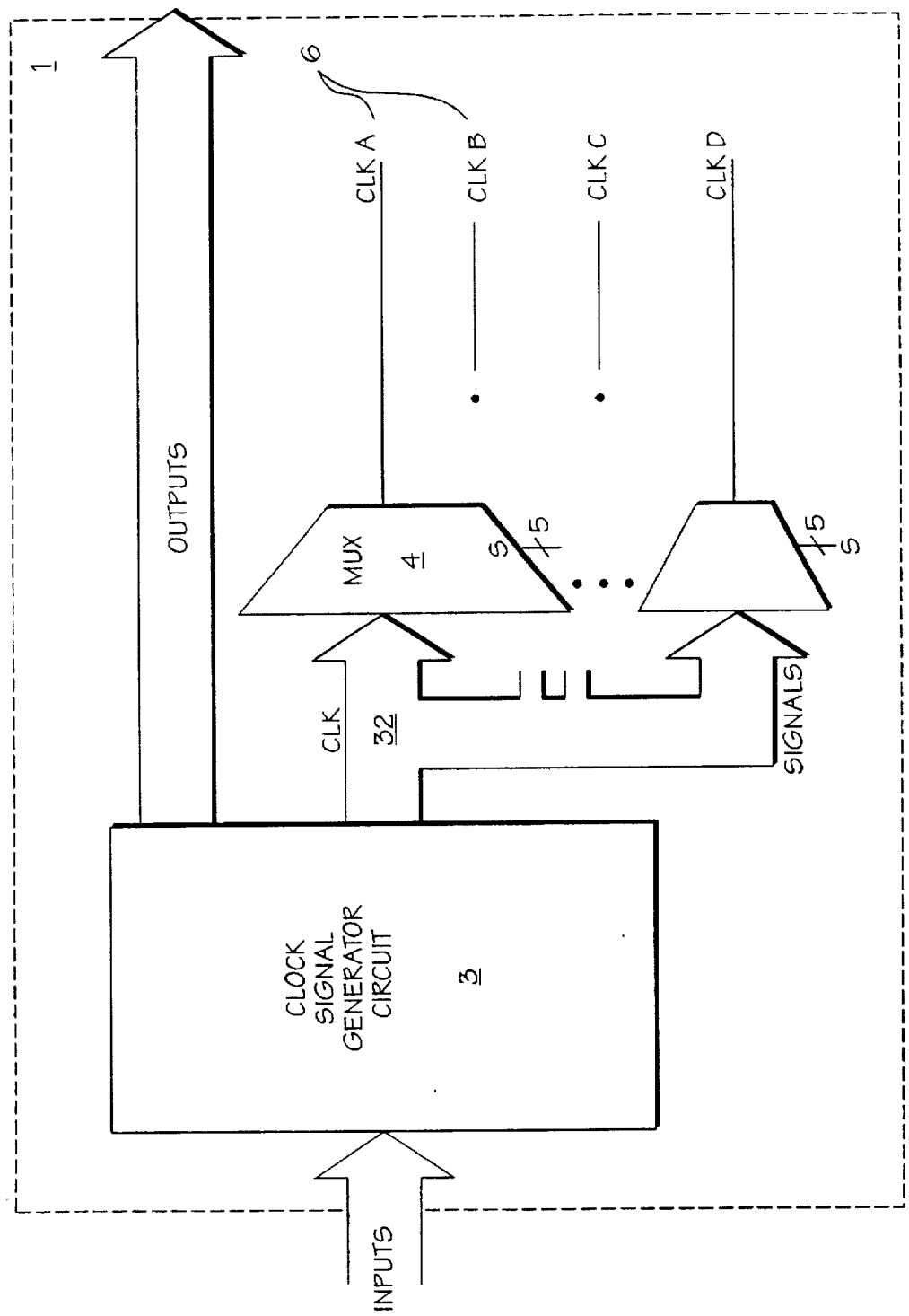
FIG. 1 illustrates a prior art architecture for frequency synthesizers.
Figure 2:
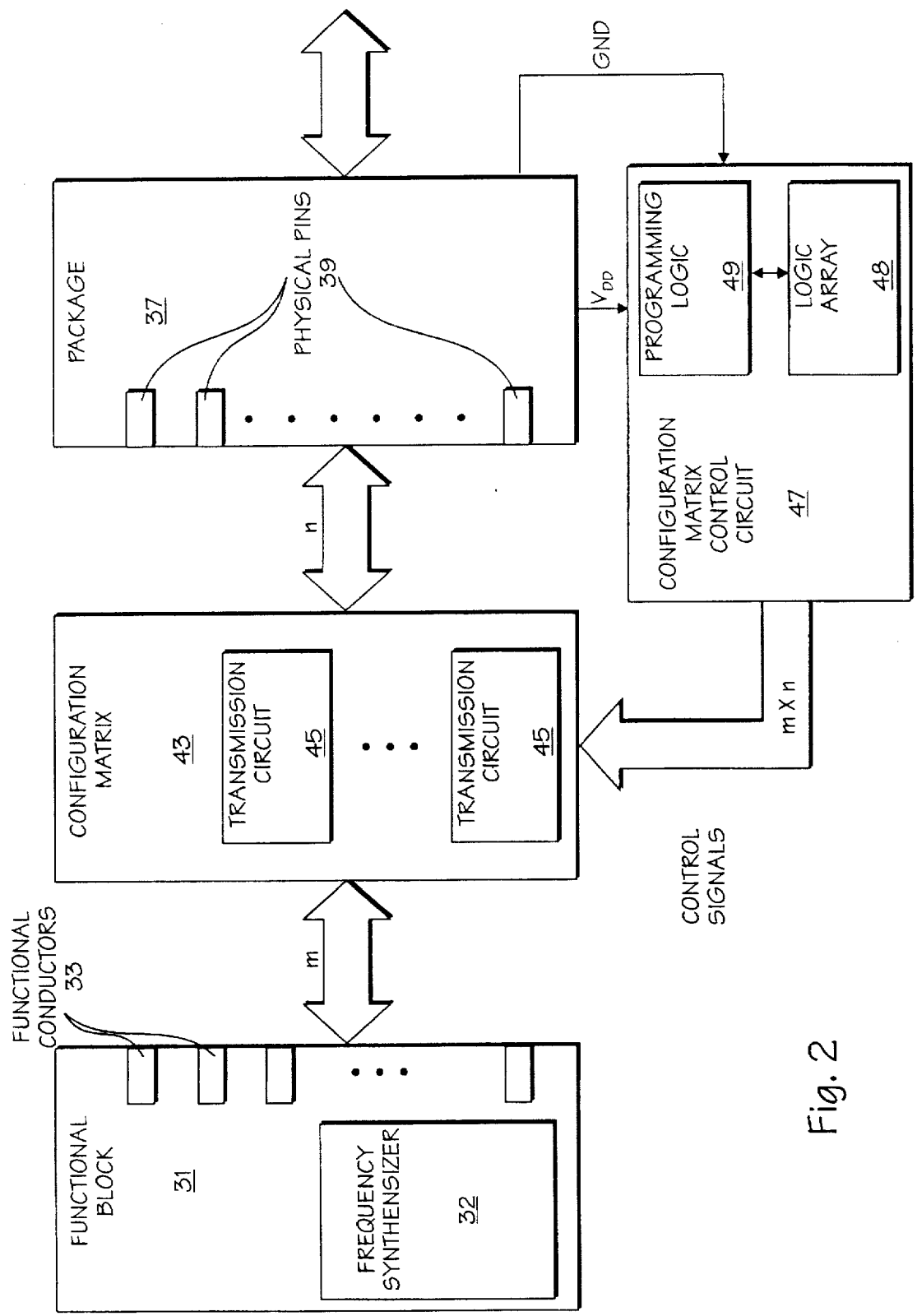
FIG. 2 illustrates one embodiment of the present invention.

FIG. 2 illustrates a block diagram of the present invention. The present invention includes a functional block 31 including a frequency synthesizer 32 and a plurality of functional conductors 33. Each of these conductors 33 represents a functional signal (e.g., the different clock frequencies, the output enable signal, the XTALIN signal and the XTALOUT signal). In the preferred embodiment, the functional conductors 33 each represent an input or output signal that is associated with a particular function of the frequency synthesizer. These functional signals will be described in FIG. 3B.

The present invention is housed in a chip package 37 that includes a plurality of physical pins 39. Although the chip package 37 is shown as a functional block, it will be understood that the chip package houses the integrated circuit containing the present invention. These physical pins 39 are configured in a predetermined way so that the chip package 37 has a predefined physical pin assignment. Users of the frequency synthesizer use this pin assignment to correctly connect other components of the computer system to the inputs and outputs of the frequency synthesizer.

The present invention also includes a configuration matrix 43 that routes each of the functional conductor 33 to a respective physical pin 39. The configuration matrix 43 includes a plurality of transmission circuits 45 that in response to a plurality of control signals selectively connects each of the functional conductors 33 with a respective physical pin 39. In other words, in response to the control signals, the configuration matrix 43 selectively routes any functional conductor 33 (ROM-table select lines, output enable, crystal input and output, suspend, shutdown, output clocks, etc.) to any physical pin 39 other than the supply and ground pins.

The supply pin ($V_{dd}$) and the ground pin (GND) are kept fixed in the physical pin assignment in order to program the frequency synthesizer.

In one embodiment, the pin configuration matrix 43 is a plurality of transmission gates. Each gate is controlled by a control signal. The control signals are resident in a logic array 48. A user programs the logic array 48 by employing programming logic 49 in the pin-configuration control circuit 47. Programming is accomplished by using the supply voltage ($V_{dd}$), ground pins (GND) and a number of other pins. An appropriate programming algorithm will be described in greater detail hereinafter.

In an alternative embodiment of the present invention, the pin configuration matrix 43 and the control circuit 47 may be implemented as a programmable interconnect matrix (PIM), which is well known in the art. PIMs are frequently used in complex programmable logic devices.

In the embodiment where the control circuit 47 is not integrated with the configuration matrix 43, the control circuit 47 may be programmed using a number of different industry standard interfaces. For example, in a JTAG interface implementation, the following signals (DIN, DOUT, MODE, CLK, VDD, and GND) are used. The DIN, DOUT, MODE, CLK signals are multiplexed onto selected pins of the package. In a JTAG interface implementation, DIN is a serial stream of ones and zeroes. DOUT is a serial stream of data coming out of the programmable logic array 48 that is coupled to the control circuit 47. The clock signal is simply a serial clock. In this implementation, the programmable logic device 48 that is part of the pin configuration control circuit 47 is a 1 by M times N logic array (e.g., EPROM).

Figure 3A:
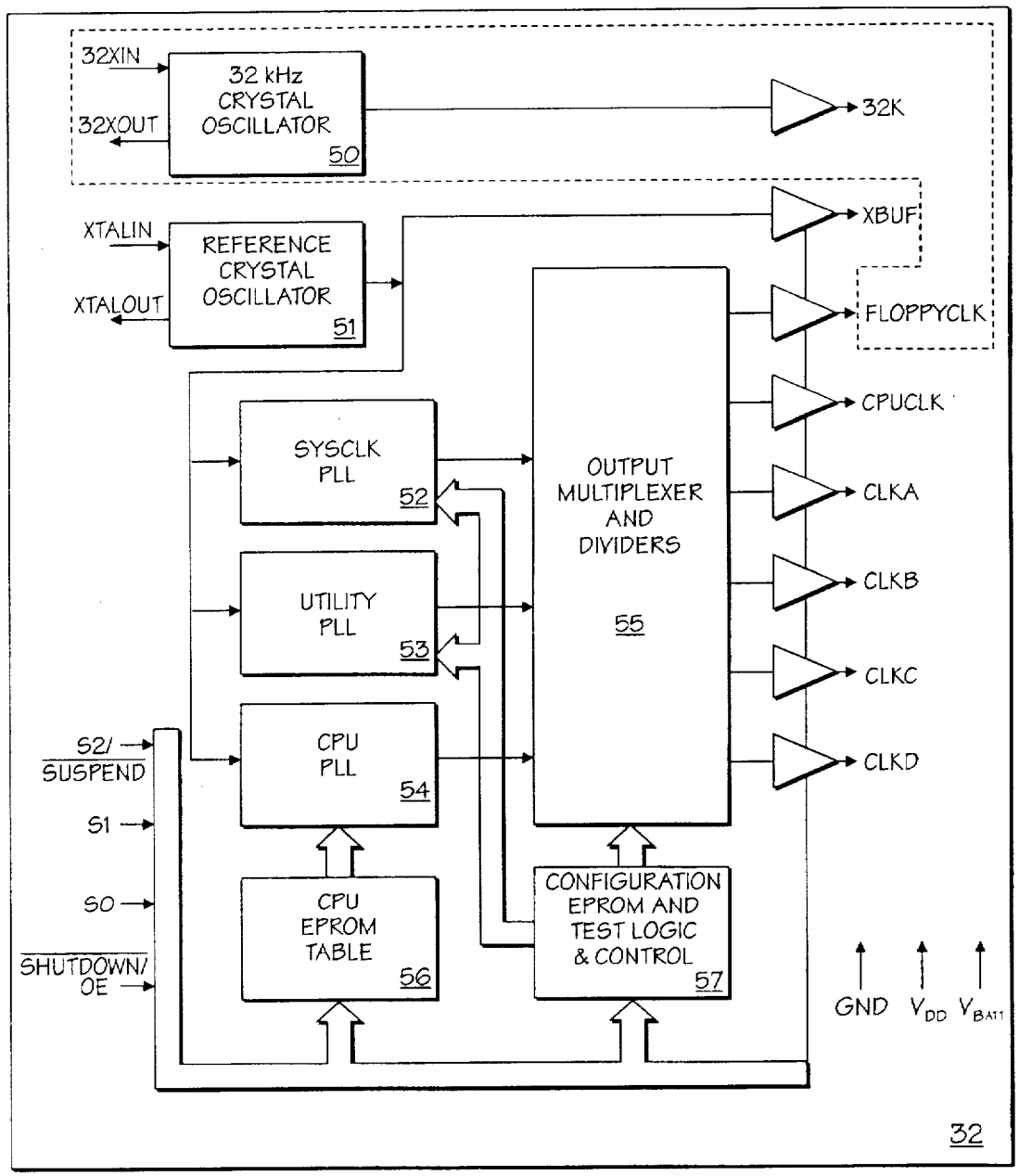
FIG. 3A illustrates in greater detail the functional block of FIG. 2.

FIG. 3A illustrates in greater detail the functional block of one embodiment of the present invention. Specifically, FIG. 3A illustrates in greater detail the frequency synthesizer 32 of functional block 31, illustrated in FIG. 2.

In this embodiment of the present invention, the frequency synthesizer 32 includes a real-time clock, implemented as a 32 kilohertz (KHz) crystal oscillator 50. This oscillator 50 is coupled to a 32 KHz crystal (external, not shown) via the 32XIN and 32XOUT functional conductors and generates a 32 kHz clock signal. The frequency synthesizer 32 further includes a reference crystal oscillator 51.

The reference oscillator 51 is coupled to a reference crystal (external, not shown) via the XTALIN and the XTALOUT functional conductors. The reference oscillator 51 generates a reference frequency and provides this reference frequency to a plurality of phase-locked loop (PLL) circuits 52-54. Each of the PLLs (e.g., SYSCLK PLL 52, UTILITY PLL 53 and CPU PLL 54) generates a clock frequency that is unrelated to the outputs of the other PLLs. These unrelated clock frequencies are provided to an output multiplexer and divider circuit 55. These unrelated clock frequencies are routed through the output multiplexer and divider circuit 55. A control circuit 57, which is coupled to the PLLs 52-53, the divider circuit 55, configures the PLLs 52-53 to run at the requested frequencies and routes the output of all the PLLs 52-54 through the appropriate dividers and multiplexers. The CPU EPROM Table 56 allows a user to select from a choice of different clock frequencies for the CPU PLL 54 by using the select signals (S2, S1, S0).

FIG. 3B describes the functional signals associated with the frequency synthesizer 32 of FIG. 3A.

Figure 4:
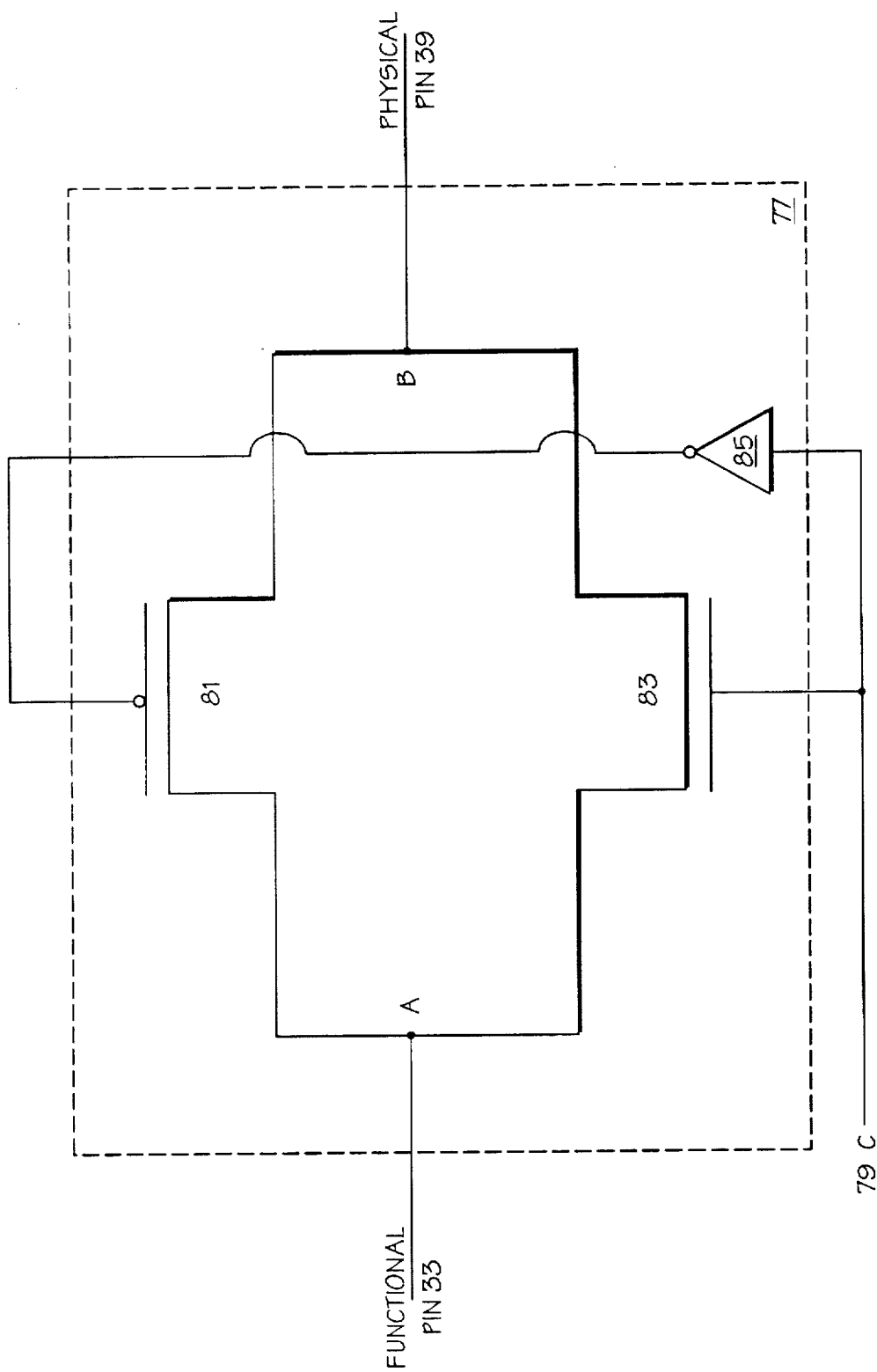
FIG. 4 illustrates the transmission circuit for one embodiment of the present invention.

As noted previously, in one embodiment of the present invention, the configuration matrix 43 includes a plurality of transmission circuits 45. FIG. 4 illustrates in greater detail the transmission circuits 45 of the present invention, as illustrated in FIG. 3A. The transmission circuit 45 may be implemented using a bi-directional pass gate 77. The bi-directional pass gate 77 may be a complimentary metal oxide semiconductor (CMOS) pass gate. In this implementation, a PMOS transistor 81 is coupled in parallel to a NMOS transistor 83. The source of the PMOS transistor 81 is coupled to the source of the NMOS transistor 83 at node A. Node A is coupled to a functional conductor 33. The drain of the NMOS transistor 83 and the drain of the PMOS transistor 81 are coupled to node B. Node B is further coupled to a physical pin 39.

The gates of the NMOS transistor 83 and the PMOS transistor 81 are coupled to a control signal 79 and the complement of the control signal, respectively. As illustrated in FIG. 4, the complement of the control signal 79 is generated by an inverter 85 that is coupled to the gate of the PMOS transistor 81. In this architecture, each functional conductor 33 is coupled to every physical pin 39 via a respective pass gate 77. Each pass gate 77 is controlled via a control signal (C) 79 that is generated by the configuration matrix control circuit 47.

For one embodiment of the present invention, the configuration matrix control circuit 47 may be programmed with an algorithm which will be described hereinafter. In this case, M functional conductors ($D_j$) are mapped to M physical pins ($P_k$). When there are N physical pins and M functional pins, for each physical pin ($P_j$) to go to M functional conductors ($D_j$), M gates are needed. However, since there are N physical pins ($P_k$), a total of N×M pass gates are needed for this implementation. The control signal 79, associated with a respective pass gate in the configuration matrix 43, is selected by the user. The pin configuration control circuit 47 is programmed in accord with the user-selected physical pin assignment by the following:

$$C(\{P_k\}_{k:0 \to N}, \{D_j\}_{j:0 \to M}) \quad := 1 \quad \text{if } D_j \text{ is assigned to } P_k;$$
$$\text{else}$$
$$:= 0.$$

The above equation simply assigns a specific control signal to a respective pass gate so that each functional conductor 33 may be selectively routed to each physical pin 39. In this embodiment, there are N×M control signals (C).

Figure 5:
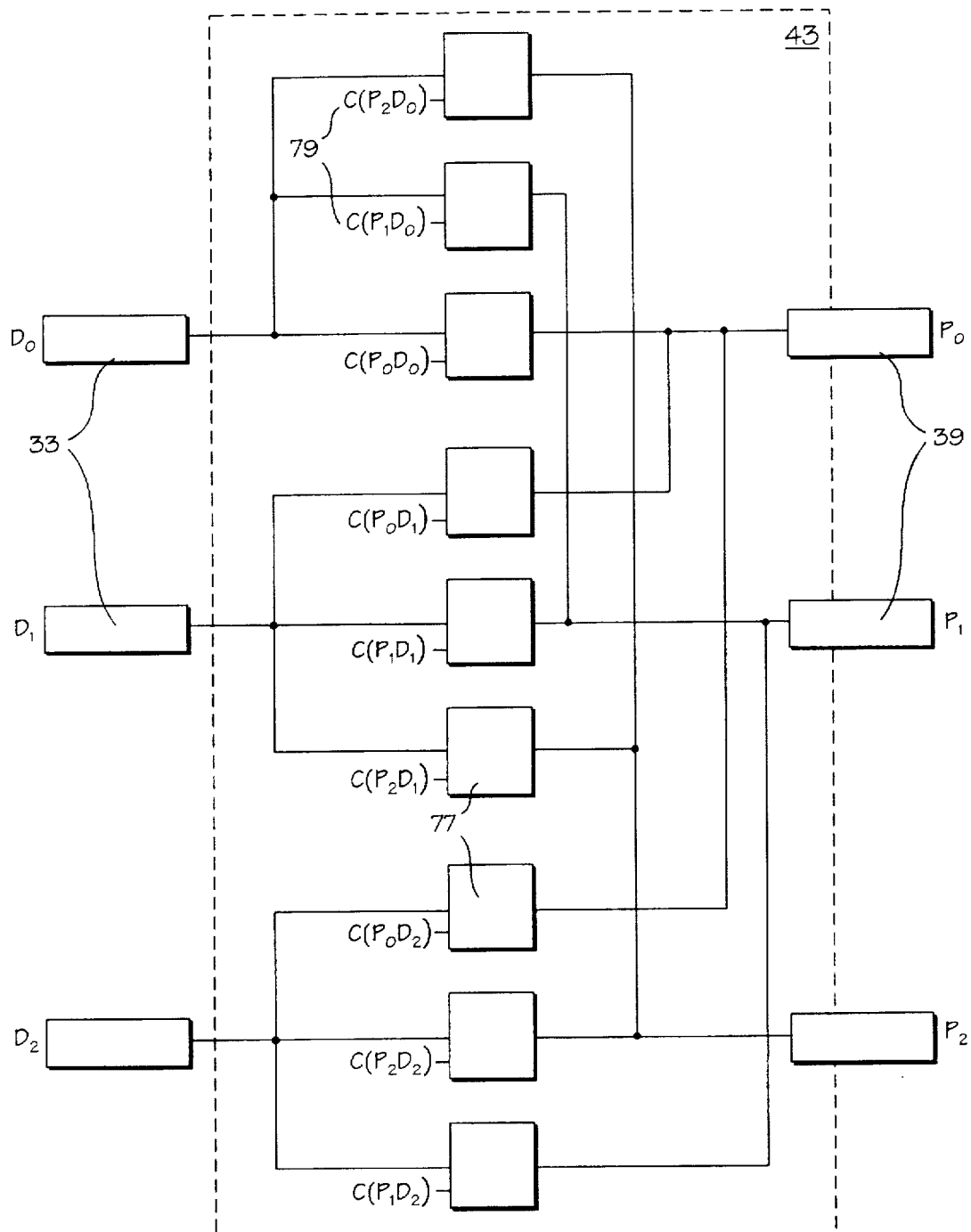
FIG. 5 illustrates in greater detail the configuration matrix for one embodiment of the present invention.

FIG. 5 illustrates a simplified illustration of the configuration matrix 43 of the present invention in which there are three functional conductors 33 and three physical pins 39. The functional conductors 33 are coupled to the physical pins 39 via the configuration matrix 43. As is illustrated in FIG. 5, each functional conductor 33 is coupled to every physical pin 39 via one of a plurality of pass gates 77. Each of these pass gates 77 is controlled via a control signal $C(P_k, D_j)$ that is generated by the configuration matrix control circuit 47. In this case, there are nine control signals with each control signal controlling one of the respective nine pass gates 77. A user simply determines the physical pin assignment for each of the physical pins 39 (i.e., assigns each functional conductor to a physical pin) and programs the logic array 48 accordingly.

In this case of a one-to-one mapping from functional conductors to physical pins (i.e., N physical pins and N functional conductors), $N^2$ control signals are used to control the $N^2$ to transmission gates. The control signals $C(P_i, D_j)$ are generated in accord with a predetermined pin assignment by the following:

$$C(\{P_k\}_{k:0 \to N}, \{D_j\}_{j:0 \to N}) \quad := 1 \quad \text{if } D_j \text{ is assigned to } P_k;$$
$$\text{else}$$
$$:= 0$$

As noted earlier the configuration matrix control circuit 47 of the present invention includes the logic array 48 and the programming logic 49. The logic array 48 may be implemented using a crossbar switch, a field programmable gate array (FPGA), or an electrically programmable read only memory (EPROM) array.

Thus, a configurable architecture for PLL-based frequency synthesizers, which enable a faster response to customer-specific requests and eliminates costly design/bonding changes has been described. The present invention describes a new architecture for routing functional conductors to the desired physical pins at programming time. The present invention provides flexibility and configurability without having to bond-out the parts differently or make mask changes.

In the foregoing specification, the invention has been described with reference to specific exemplary embodiments thereof. It will however be evident that various modifications and changes may be made thereto without departing from the broader spirit and scope of the invention as set forth in the appended claims. The specification and drawings are accordingly to be regarded as illustrative rather than restrictive.

What is claimed is:

1. A pin-configurable frequency synthesizer comprising:
   a) a functional block having a frequency synthesizer coupled to a plurality of functional conductors, each functional conductor representing a functional signal;
   b) a plurality of physical pins, wherein each physical pin is assignable to one of the functional conductors; and
   c) a configuration matrix for selectively connecting each functional conductor with each and every physical pin; and
   d) a control circuit, coupled to the configuration matrix, for controlling the configuration matrix and selectively coupling the functional conductors to the physical pins, in accordance with a user-defined assignment wherein the control circuit generates control signals (C) that map the physical pins ($P_k$) to the functional conductors ($D_j$) based on the following:

$$C(\{P_k\}_{k:0 \to N}, \{D_j\}_{j:0 \to M}) \quad := 1 \quad \text{if } D_j \text{ is assigned to } P_k;$$
$$\text{else}$$
$$:= 0$$

where M is the number of physical pins and N is the number of functional conductors.

2. The pin-configurable frequency synthesizer as set forth in claim 1 wherein the configuration matrix includes a plurality of transmission gates.

3. The pin-configurable frequency synthesizer as set forth in claim 2 wherein the transmission gate is a complementary metal oxide semiconductor (CMOS) bi-directional gate.

4. The pin-configurable frequency synthesizer as set forth in claim 1 wherein the frequency synthesizer further includes:
   a real-time clock oscillator.

5. The pin-configurable frequency synthesizer as set forth in claim 1 wherein the frequency synthesizer further includes:
   a reference crystal oscillator coupled to reference crystal via a XTALIN functional conductor and a XTALOUT functional conductor, for generating a reference clock frequency.

6. The pin-configurable frequency synthesizer as set forth in claim 1 wherein the frequency synthesizer further includes:
   (a) a plurality of phased lock loop circuits each receiving a reference frequency and generating different clock frequencies.

7. The pin-configurable frequency synthesizer as set forth in claim 1 wherein the frequency synthesizer further includes:
   (a) an output multiplexer and divider circuit for generating a plurality of clock signals of different frequencies;
   (b) a control and test logic circuit coupled to the output multiplexer and divider circuit for selectively routing input frequencies to the respective outputs of the output multiplexer and divider circuit;
   (c) a logic array coupled to a phase locked loop circuit, said logic array having a plurality of select inputs;
   wherein a user selects one of a selection of output frequencies for the phase locked loop circuit via the select inputs said output frequencies also being said input frequencies to said multiplexer and divider circuit.

8. The pin-configurable frequency synthesizer as set forth in claim 1 wherein the configuration matrix and the control circuit are integrated into a programmable interconnect matrix (PIM).

9. A pin-configurable frequency synthesizer comprising:
   a) a functional block having a frequency synthesizer coupled to a plurality of functional conductors each functional conductor representing a functional signal;
   b) a plurality of physical pins, wherein each physical pin is assignable to one of the functional conductors;

c) a configuration matrix for selectively connecting each functional conductor with each and every physical pin; and d) a control circuit, coupled to the configuration matrix, for controlling the configuration matrix and selectively coupling the functional conductors to the physical pins, in accordance with a user-defined assignment wherein the control circuit further includes a logic array, coupled to the configuration matrix, for storing a plurality of control signals, said control signals for controlling the configuration matrix; and a programming logic circuit, coupled to the logic array, for programming the logic array with the plurality of control signals as determined by the user.

10. The pin-configurable frequency synthesizer as set forth in claim 9 wherein the frequency synthesizer further includes:

a real-time clock oscillator.

11. The pin-configurable frequency synthesizer as set forth in claim 9 wherein the frequency synthesizer further includes:

a reference crystal oscillator coupled to reference crystal via a functional conductor, for generating a reference clock frequency.

12. The pin-configurable frequency synthesizer as set forth in claim 9 wherein the frequency synthesizer further includes:

a plurality of phased lock loop circuits for receiving a reference frequency and generating different clock frequencies.

13. The pin-configurable frequency synthesizer as set forth in claim 10 wherein the configuration matrix and the control circuit are integrated into a programmable interconnect matrix (PIM).

14. A pin-configurable frequency synthesizer comprising:

a functional block having a reference crystal oscillator coupled to a plurality of functional conductors, the reference crystal oscillator for generating a reference clock frequency, each functional conductor representing a functional signal;

a plurality of physical pins, wherein each physical pin is assignable to one of the functional conductors;

a configuration matrix for selectively connecting each functional conductor with a respective one of the plurality of physical pins;

a control circuit, coupled to the configuration matrix, for controlling the configuration matrix and selectively coupling the functional conductors to the physical pins, in accordance with a user-defined assignment;

an output multiplexer and divider circuit, coupled to receive said reference clock frequency, for generating a plurality of clock signals of different frequencies;

a control and test logic circuit coupled to the output multiplexer and divider circuit for selectively routing input frequencies to the respective outputs of the output multiplexer and divider circuit; and a logic array coupled to a phase locked loop circuit, said logic array having a plurality of select inputs;

wherein a user selects one of a selection of output frequencies for the phase locked loop circuit via select inputs said output frequencies also being said input frequencies to said multiplexer and divider circuit.

15. The pin-configurable frequency synthesizer as set forth in claim 14 further comprising:

a plurality of phased lock loop circuits each receiving the reference clock frequency and generating different clock frequencies.

16. The pin-configurable frequency synthesizer as set forth in claim 14 wherein the configuration matrix and the control circuit are integrated into a programmable interconnect matrix (PIM).

\* \* \* \* \*